US006318953B1

(12) United States Patent
Bonora et al.

(10) Patent No.: US 6,318,953 B1
(45) Date of Patent: Nov. 20, 2001

(54) SMIF-COMPATIBLE OPEN CASSETTE ENCLOSURE

(75) Inventors: Anthony C. Bonora, Menlo Park; Robert Netsch, Alameda; Patrick Sullivan, Pleasanton, all of CA (US); William J. Fosnight; Joshua Shenk, both of Austin, TX (US); Edwin Noma, Fremont, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/351,986

(22) Filed: Jul. 12, 1999

(51) Int. Cl.[7] .................................................. B65G 63/00
(52) U.S. Cl. .......................... 414/754; 414/217; 414/222; 414/768; 414/935; 414/936
(58) Field of Search ...................................... 414/217, 222, 414/223, 225, 936, 935, 937, 939, 938, 940, 416, 768, 799, 292, 754

(56) References Cited

U.S. PATENT DOCUMENTS

| 4,911,597 | * | 3/1990 | Maydan et al. | 414/217 |
|---|---|---|---|---|
| 5,226,758 | * | 7/1993 | Tanaka et al. | 406/86 |
| 5,255,783 | | 10/1993 | Goodman et al. . | |
| 5,390,785 | * | 2/1995 | Gaeeic et al. | 206/213.1 |
| 5,443,348 | * | 8/1995 | Biche et al. | 414/416 |
| 5,507,614 | * | 4/1996 | Leonov et al. | 414/768 |
| 5,525,024 | * | 6/1996 | Freerks et al. | 414/416 |
| 5,857,827 | * | 6/1999 | Asakawa et al. | 414/799 |
| 5,895,191 | * | 4/1999 | Bonora et al. | 414/217 |
| 5,947,675 | * | 9/1999 | Matsushima | 414/416 |
| 5,947,677 | * | 9/1999 | Matsushima et al. | 414/609 |
| 6,082,949 | * | 7/2000 | Rosenquist | 414/217 |
| 6,091,498 | * | 7/2000 | Hanson et al. | 356/375 |

* cited by examiner

Primary Examiner—Joseph A. Fischetti
(74) Attorney, Agent, or Firm—Fliesler Dubb Meyer & Lovejoy LLP

(57) ABSTRACT

An ergonomic loading assembly for an I/O port onto which a bare cassette may be easily loaded and unloaded. The loading assembly further provides isolation between the operator and the I/O port after loading of a cassette to minimize safety risks and to minimize the amount of particulates and contaminants around the workpieces while on the port. In a preferred embodiment, the loading assembly includes a cover assembly having a stationary cover section around the port plate, and two pivoting cover sections which open and close like jaws to allow a cassette to positioned within the cover assembly when opened and which enclose the cassette within the cover assembly when closed. The loading assembly further includes a pivoting deck onto which the cassette is loaded when the pivoting cover sections are open. The deck receives the cassette with the workpieces oriented at or near vertical. Thereafter, as the pivoting cover sections are closed, the pivoting deck rotates the cassette and seats the cassette on the port door of the port with the workpieces positioned in a horizontal orientation. Thereafter, the port plate, pivoting deck and cassette may be transferred away from the port plate so that processing of the workpieces in the cassette by the processing tool may take place.

3 Claims, 9 Drawing Sheets

SMIF-COMPATIBLE OPEN CASSETTE ENCLOSURE

BACKGROUND OF THE INVENTION

1. Field of the Invention

The present invention relates to a input/output port, and in particular to an enclosure mounted on a SMIF input/output port for allowing transfer of a bare cassette to and from a processing tool on which a SMIF input/output port is mounted, which enclosure isolates the operator from the interior of the input/output port after the cassette is loaded.

2. Description of the Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, Jul. 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half gm and under. Unwanted contamination particles which have geometries measuring greater than 0.1 $\mu$m substantially interfere with 0.5 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles become of interest.

A SMIF system has three main components: (1) minimum volume, sealed pods used for storing and transporting wafer cassettes; (2) a minienvironment supplied with ultraclean air flows surrounding cassette load ports and wafer processing areas of processing stations so that the environments inside the pods and minienvironment become miniature clean spaces; and (3) robotic input/output (I/O) port assemblies to load/unload wafer cassettes and/or wafers from the sealed pods to the processing equipment without contamination of the wafers in the wafer cassette from external environments. The system provides a continuous, ultraclean environment for the wafers as they move through the wafer fab.

Many wafer fabrication sites have not yet, or have only partially, transitioned to a SMIF solution. A partial transition may involve the use of the SMIF I/O port affixed to the front end of a process tool, but instead of the SMIF pods, the wafers or other such workpieces are transported around the fab in bare cassettes. In this situation, an operator carries a cassette to the I/O port and positions the cassette on a port door of the I/O port so that the cassette may thereafter be lowered down through the I/O port for workpiece transfer to and from the processing tool. Manual loading of bare cassettes onto SMIF I/O ports has conventionally presented some disadvantages.

First, when transporting bare cassettes around a fab, the workpieces within the cassette are preferably oriented at or near vertical to prevent the workpieces from falling out of the cassette. However, in order to properly load a cassette onto an I/O port, the operator must rotate the cassette so that the workpieces are horizontally oriented on the port. The repeated rotation of a cassette involved with loading and unloading cassettes to and from the various I/O ports within a fab can result in operator fatigue or repetitive strain injury to an operator's wrists and arms. Additionally, care must be taken during rotation of the cassettes to avoid vibration and rattling of the workpieces within the cassette and to prevent the workpieces from sliding forward or falling out of the cassette.

A further safety related problem is that so-called "pinch points" are created in the space between the port plate and the port door when the plate and door are separated. An operator must be careful to keep his or her hands clear of these pinch points as the port door returns to its home position seated in the port plate. A still further safety related hazard is that SMF I/O ports are typically provided with a laser underneath the port plate which is used to generate workpiece mapping and positional information. There is a concern that retinol damage may occur as a result of an operator looking into the laser when the port door is lowered away from the port plate.

In addition to safety considerations, a further concern in manual loading of bare cassettes onto a SMIF I/O port is that an operator may inadvertently damage the I/O port or the interior of the process tool to which the I/O port is affixed.

SUMMARY OF THE INVENTION

It is therefore an advantage of the present invention to provide a cover on an I/O port which isolates the operator from the interior of the port after a bare cassette has been loaded onto the port.

It is another advantage of the present invention to provide a cover with an ergonomic design which automatically pivots a cassette after it is manually loaded to relieve operator fatigue and strain otherwise occurring as a result of manual rotation of the cassette.

It is another advantage of the present invention to provide a class 0.1 environment around a bare cassette loaded onto an I/O port.

It is a further advantage of the cover according to the present invention that it may adapted for use with a conventional SMIF I/O port.

It is a still further advantage of the cover according to the present invention that it operates with the same software and make use of the same operations sequence for operating a conventional SMIF I/O port.

These and other advantages are provided by the present invention which in a preferred embodiment relates to an ergonomic loading assembly for an I/O port onto which a bare cassette may be easily loaded and unloaded. The loading assembly further provides isolation between the operator and the I/O port after loading of a cassette to minimize safety risks and to minimize the amount of particulates and contaminants around the workpieces while on the port. In a preferred embodiment, the loading assembly includes a cover assembly having a stationary cover section around the port plate, and two pivoting cover sections which open and close like jaws to allow a cassette to be positioned within the cover assembly when opened and which enclose the cassette within the cover assembly when closed.

The loading assembly further includes a pivoting deck onto which the cassette is loaded when the pivoting cover sections are open. The deck receives the cassette with the workpieces oriented at or near vertical. Thereafter, as the pivoting cover sections are closed, the pivoting deck rotates the cassette and seats the cassette on a port door of the port with the workpieces positioned in a horizontal orientation. Thereafter, the port plate, pivoting deck and cassette may be separated away from the port plate so that processing of the workpieces in the cassette by the processing tool may take place.

In an alternative embodiment, a bare cassette may be loaded into an enclosure assembly including cover sections and a door that replicate a conventional SMIF pod. One of the cover sections pivots between an open position where the cassette is loaded into the enclosure, and a closed position where the cassette is isolated within the enclosure. Once inside the enclosure, the port door, with the enclosure door and cassette supported thereon, are lowered away from the port plate so that processing of the workpieces in the cassette by the processing tool may take place.

BRIEF DESCRIPTION OF THE DRAWINGS

The present invention will now be described with reference to the figures in which.

DETAILED DESCRIPTION

Figure 1:
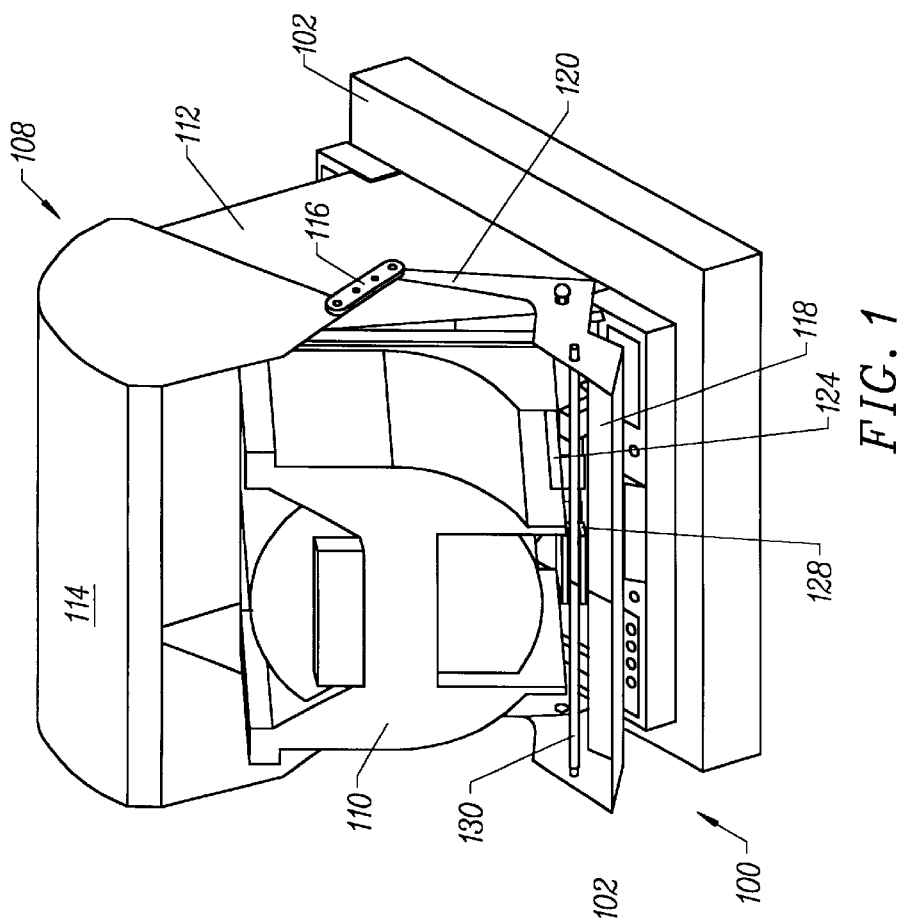
FIG. 1 is a perspective view of an I/O port including a cover according to the present invention having a workpiece cassette loaded therein.
Figure 2:
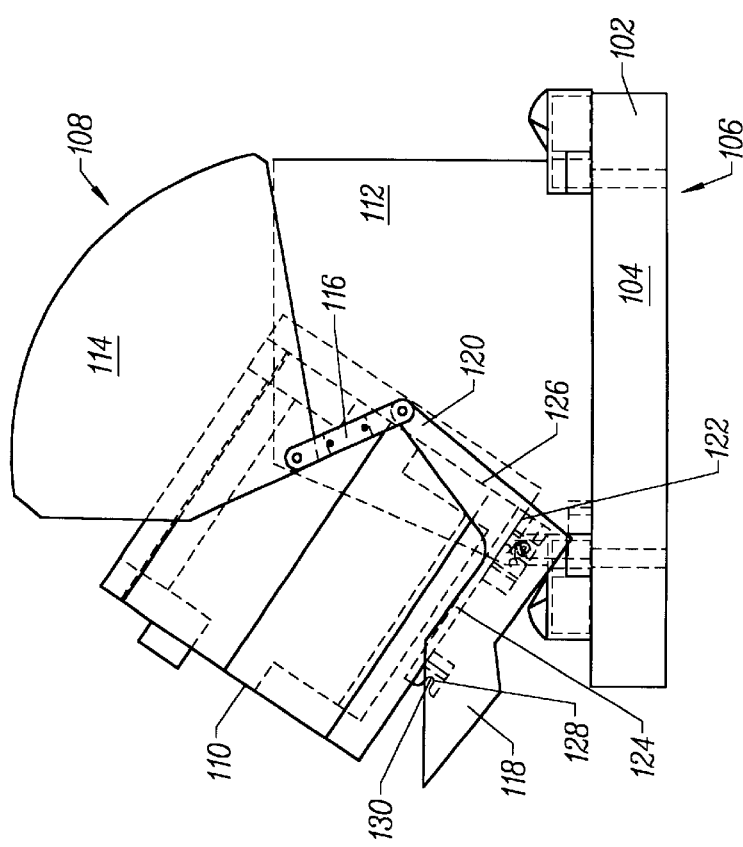
FIG. 2 is a side view of an I/O port including a cover according to the present invention shown in the open position for receiving a workpiece-carrying cassette therein.
Figure 3:
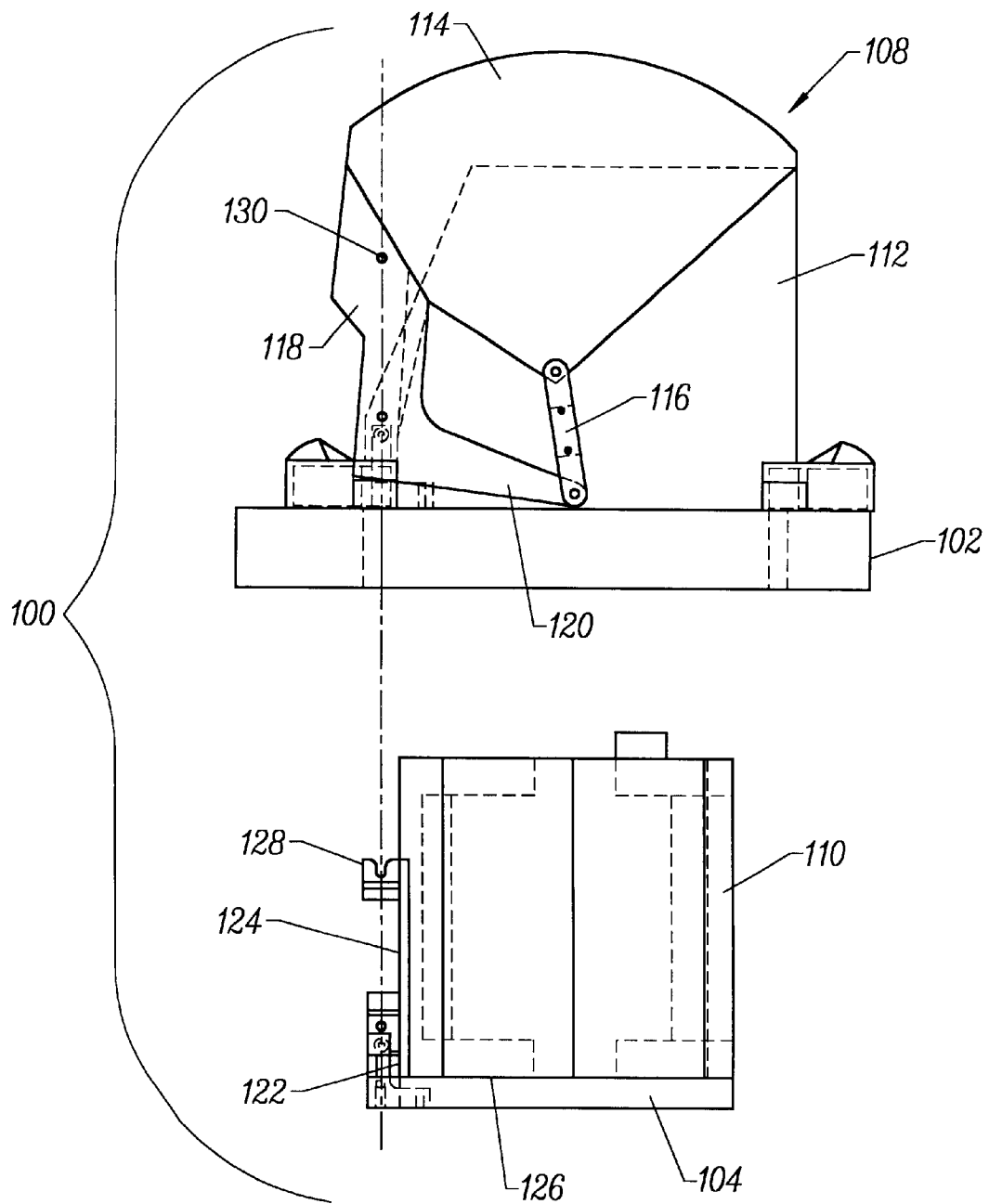
FIG. 3 is a side view of a load port including a cover according to the present invention in the closed position.
Figure 4C:
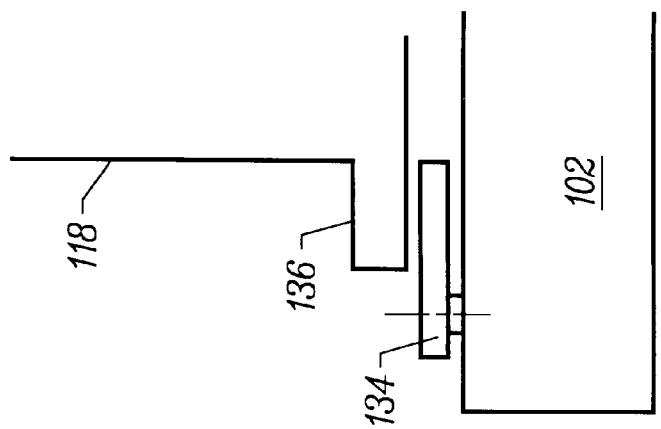
FIGS. 4A–4C are partial side views showing the mechanisms according to the present invention for preventing opening of the cover sections while the port door is lowered away from the port plate.
Figure 4B:
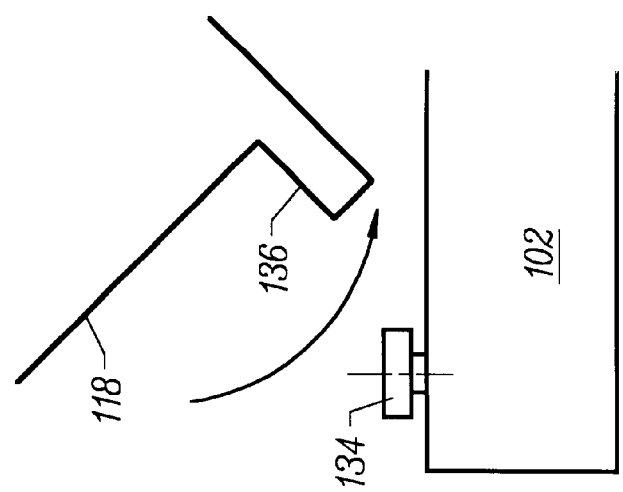
Figure 4A:
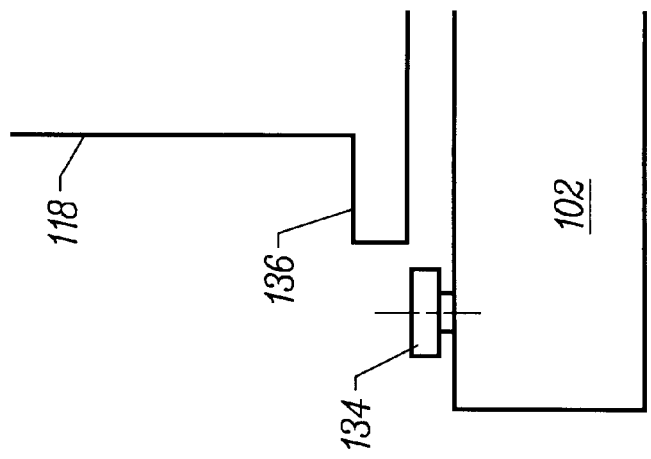

The present invention will now be described with reference to FIGS. 1–10 which in general relate to a system for loading a bare cassette into a processing tool through a SMIF I/O port affixed to the front end of the processing tool. The cassette may be any type of container for carrying one or more workpieces such as semiconductor wafers, reticles and flat panel displays. As shown in FIGS. 1–3, the I/O port 106 includes a port door 104 and a port plate 102 circumjacent about the port door when there is no cassette present on the port. Although not critical to the present invention, the I/O port may further include a minienvironment (not shown) located below the port plate. After a cassette is loaded as explained hereinafter, the port door lowers away from the port plate via an elevator affixed to the port door to lower the cassette into the minienvironment. Thereafter, a robot may transfer the individual workpieces and/or the entire cassette to and from the process tool for processing.

Referring still to FIGS. 1–3, according to the present invention, the cassette loading assembly 100 is provided for receiving a bare cassette 110 with the workpieces oriented at or near vertical, rotating the cassette so that the workpieces are substantially horizontally oriented, and isolating the cassette and I/O port from the operator after the cassette has been loaded. The cassette loading assembly 100 is mounted to the port plate 102 and port door 104, as explained hereinafter, and includes a cover assembly 108 comprised of a stationary section and two pivoting sections. The three sections together are capable of opening to accept a bare cassette 110 and then closing to provide the isolating enclosure around the cassette.

The cover assembly 108 comprises a stationary cover section 112 stationarily mounted to and extending upward from the port plate. The stationary cover section can be bolted or screwed onto the port plate or affixed to the port plate through other known affixation schemes. In a preferred embodiment, the section 112 is formed of a rigid, durable and static dissipative material such as stainless steel. It is understood that other materials such as aluminum or plastics such as polycarbonate may be used.

The stationary cover section includes a planar rear wall extending along a rear of the port plate and a pair of planar side walls extending along the sides of the port plate to surround the I/O port on three sides. The height of stationary cover section 112 is preferably the approximate height of the cassette 110, but it is understood that the height of the section 112 could be higher in alternative embodiments.

The cover assembly further includes an upper pivoting cover section 114 pivotally mounted to the stationary cover section 112. The upper pivoting cover section preferably includes a pair of planar side panels substantially parallel to the side walls of the stationary cover section, and a central, arcuately shaped panel connected to the side panels. In a preferred embodiment, the side panels are formed of a rigid, static dissipative material such as stainless steel, and the central panel may be formed of stainless steel with a transparent window section formed of, for example, polycarbonate to allow viewing of the cassette within the cover section. It is understood that the side and central panels may be formed of other materials in alternative embodiments, and the central panel may be formed completely of stainless steel, or completely of polycarbonate in alternative embodiments. It is further understood that other transparent materials may be used instead of polycarbonate, which may be static dissipative, in alternative embodiments.

The side panels are pivotally mounted at a rear portion of the side walls of the stationary cover section so as to allow the upper pivoting cover section to pivot between an open and a closed position. The side panels of the upper pivoting cover section are also each pivotally mounted to a first end of a pair of linking members 116 at each side of the stationary cover section, the purpose of which is explained hereinafter. The side panels are spaced apart so that they are located outwardly of the side walls of the stationary cover section. Thus, the side panels of the upper pivoting cover section can pivot down over the side walls of the stationary cover section without contacting the sides of the stationary cover section when the upper pivoting cover section is moved to its closed position. The spacing between the side panels and the side walls is preferably small to prevent the entry of contaminants therebetween. The interior of the processing tool and I/O port are preferably maintained at a higher pressure than the surrounding fab space, so that ultraclean air (typically class 0.1) from within the I/O port is forced out of the port, through the cover assembly 108, and out to the fab through spaces between the sections of the cover assembly. Thus, after the cassette is loaded into the loading assembly 100, and the cover sections are closed, the cassette is maintained in an ultraclean environment.

The cover assembly 108 finally includes a lower pivoting cover section 118 including a pair of side panels generally parallel to and coplanar with the side panels of the upper pivoting cover section. The lower pivoting cover section 118 further includes a central panel extending between the side panels. The side panels are preferably formed of stainless steel, or other rigid, durable and static dissipative material, and the central panel is preferably formed of stainless steel with a central transparent window formed of polycarbonate. As with the central panel of the upper pivoting cover section, the central panel of the lower pivoting cover section may be formed entirely of stainless steel, or entirely of polycarbonate in alternative embodiments. The transparent window may also be formed of other, static dissipative materials in alternative embodiments.

The side panels of the lower pivoting cover section 118 are pivotally mounted to a front, bottom portion of each side wall of the stationary cover section so as to pivot between open and closed positions. Each side panel of the lower pivoting cover section includes a finger 120 extending therefrom, which finger is pivotally affixed to a second end of the linking member 116 opposite the end of the linking member affixed to the upper pivoting cover section 114.

As shown in FIG. 3, when in the closed position, the edges of the upper pivoting cover section mate with the edges of the lower pivoting cover section so that, together with the stationary cover section, the various sections of the cover assembly form a complete enclosure around a cassette when the cover assembly is closed. In a preferred embodiment, a slight space may exist between the edges of the respective central panels of the upper and lower pivoting cover sections so that ultraclean air within the cover assembly may exit to the surrounding atmosphere.

The cover assembly 108 may be manually or automatedly moved between its open and closed positions. For manual opening, in a preferred embodiment, a handle (not shown) is located on the central panel of the lower pivoting cover section. The linking member is pivotally connected between the upper and lower pivoting cover sections so that as the lower pivoting cover section is rotated outward (i.e., counterclockwise in FIG. 2) to its open position, the linking member 116 causes the upper pivoting cover section to raise upward to its open position. When the upper and lower pivoting cover sections are in their open positions, the cassette 110 may be loaded into the cassette loading assembly 100 as explained in greater detail hereinafter. The upper pivoting cover section is also rotated downward to its closed position by the linking member when the lower pivoting cover section is rotated inward to its closed position.

It is alternatively contemplated that the handle may be located on the upper pivoting cover section. In this embodiment, the upperpivoting cover section drives the lower pivoting cover section between its open and closed positions via the linking member 116. As would be appreciated by those of skill in the art, a small linear lead screw drive could be inserted between the upper pivoting cover section and the stationary cover section, or the lower pivoting cover section and the stationary cover section, for automated opening and closing of the cover assembly 108.

Referring now to FIGS. 1–3, 5A and 5B, in addition to the cover assembly 108, the loading assembly 100 according to the present invention further includes a pivoting deck 122 which is pivotally mounted to port door 104. Pivoting deck 122 includes a first plate 124 and a second plate 126 oriented at approximately 90° to each other so as to form an L-shaped member. As shown in FIGS. 1, 2, 5A and 5B, when the port door is in its home position within port plate 102, the pivoting deck 122 is affixed to the lower pivoting cover section 118 via a U-shaped member 128 mounted to the first plate 124. The U-shaped member holds the pivoting deck on the lower pivoting cover section as a result of the U-shaped member engaging a rod 130 mounted in the side panels of the lower pivoting cover section.

Figure 5A:
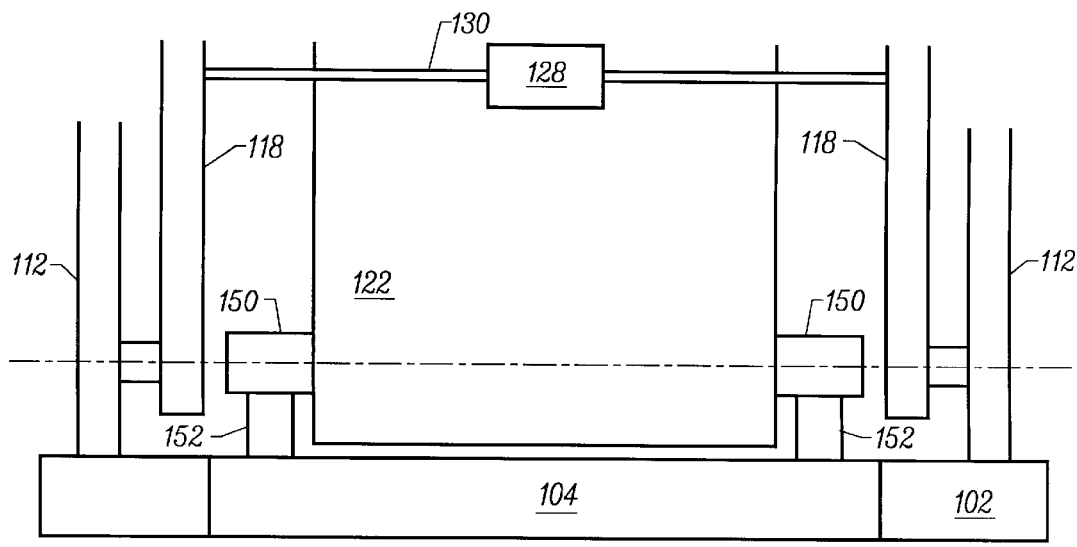
FIG. 5A is a partial front view of portions of the cover sections and pivoting deck engaged with each other according to the present invention.
Figure 5B:
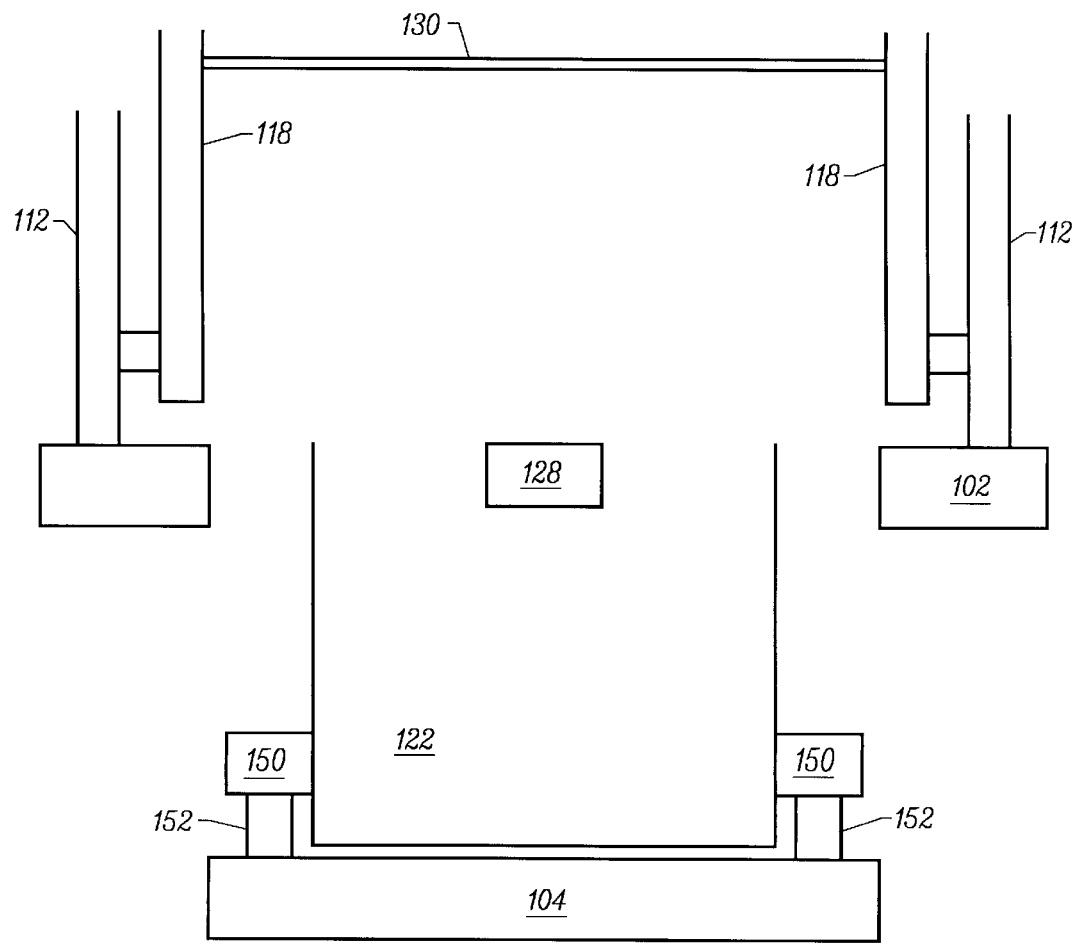
FIG. 5B is a partial front view of portions of the cover sections and pivoting deck disengaged from each other according to the present invention.
Figure 6:
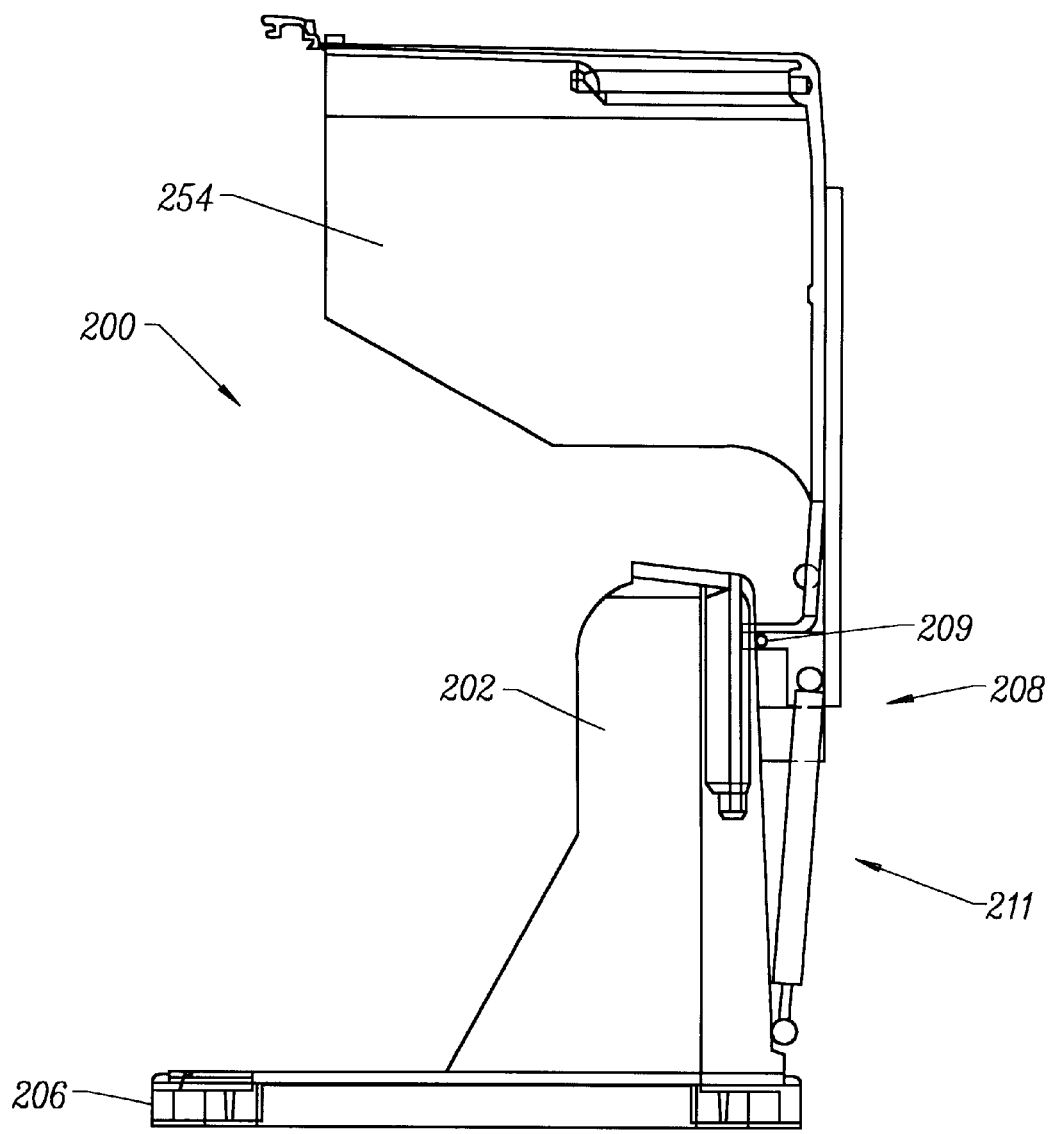
FIG. 6 is a side view of an alternative embodiment of an enclosure according to the present invention with the cover sections in an open position.

As shown in FIGS. 5A and 5B and as explained in greater detail below, when the cover assembly 108 is closed and the port door lowers, the U-shaped section 128 disengages from the rod 130. However, when the port door is in its home position in the port plate (as shown in FIGS. 1, 2 and 5A), the U-shaped section 128 firmly engages rod 130, and the pivoting deck moves with the lower pivoting cover section as the lower pivoting section opens and closes.

Although the lower pivoting cover section 118 is pivotally mounted to the stationary cover section 112, and the pivoting deck 122 is pivotally mounted to the port door, the lower pivoting cover section 118 and the pivoting deck 122 share the same axis of pivot as shown by the dashed line in FIG. 5A. This allows the pivoting deck 122 to freely pivot with the lower pivoting cover section 118 upon opening and closing of the section 118. As would be appreciated by those of skill in the art, a pair of bearing/damper assemblies 150 (discussed in greater detail below) may be mounted to the port door 104 via a pair of standoffs 152 to allow concentric pivot axes between the lower pivoting cover section 118 and the pivoting deck 122.

When the cover section is open, the cassette 110 may be loaded onto the pivoting deck so that a rear of the cassette (which is oriented downward when carried by the operator to the I/O port) is loaded against and supported by the first plate 124 of the pivoting deck 122, and the bottom of the cassette is loaded against the second plate 126. The first plate 124 of the pivoting deck 122 may include a pair of sloped guides which engage ribs conventionally formed on the back of the cassette 110 to guide the cassette into a proper position between the guides. The guides are preferably formed of Delrin or another material having a low coefficient to friction to minimize particulates between the cassette and the guides. The second plate 126 may include registration features, which together with the guides on the first plate 124 ensure proper and repeatable positioning of the cassette on the pivoting deck.

The position of the pivoting deck when the cover assembly 108 is in the open position allows an operator to load the cassette 110 substantially as it is carried to the I/O port (ie., with the workpieces oriented at or near vertical). In one embodiment, the pivoting deck may open to receive the cassette with the workpieces oriented at an angle 5° from vertical. Once the cassette 110 is loaded onto the pivoting deck 122, the cover assembly 108 is closed as described above. Closing the cover assembly rotates the pivot deck so that the second plate 126 lies against the port door and the workpieces are horizontally oriented. In an embodiment where the workpieces are received at an angle 5° from vertical, the pivot deck rotates 85° to position the workpieces at horizontal. It is understood that the angle at which the cassette is received may vary in alternative embodiments.

The port door conventionally includes a pod-in-place sensor. Once the cover section is closed and the deck is rotated into engagement with the port door, second plate 126 contacts and activates the pod-in-place sensor. Thereafter, the control circuitry for the I/O port lowers the port door away from the port plate.

While the port door is lowered away from the port plate, it is desirable that an operator not be able to open the cover assembly. In a conventional SMIF I/O port, the port plate includes a pair of fingers which rotate in a plane parallel to the port plate. In a conventional SMIF system, the fingers are provided to rotate inward, into engagement with a pod shell, to hold the pod shell in place on the port plate while the port door and pod door are lowered away from the port plate and pod shell. These fingers may be utilized in the present invention to prevent opening of the cover assembly while the port door is lowered away from the port plate. In particular, referring initially to FIG. 4A, the finger 134 is shown mounted on the port plate 102 in its retracted position. A bottom portion of the central panel of the lower pivoting cover section 118 includes a protrusion 136. When the finger 134 is in its retracted position, as when there is no cassette on the I/O port, the lower pivoting cover section is free to rotate from its closed position shown in FIG. 4A to an open position shown in FIG. 4B. However, once the pod-in-place sensor indicates that a cassette has been loaded onto the port door, and the port door is ready to lower away from the port plate, the finger 134 pivots inward to its position shown in FIG. 4C. In this position, the finger 134 is located directly beneath the protrusion 136, thus preventing the lower pivoting cover section 118, and the entire cover assembly 108, from opening. Once processing of the workpieces within cassette 110 is completed, and the port door has been returned to its home position within the port plate, the control circuitry for the I/O port rotates finger 134 back to its home position shown in FIG. 4A, thus allowing the cover assembly to be opened, and the cassette 110 to be removed.

As indicated above, pivoting deck 122 is mounted on the port door via bearing/damper assemblies 150 and standoffs 152. As the port door lowers away from the port plate, the pivoting deck with the cassette seated thereon lowers with the port door. At this point, the U-shaped member 128 moves away from the rod 130, and the pivoting deck 122 completely disengages from the lower pivoting cover section 118 (as shown in FIG. 5B). Thereafter, workpiece transfer to and from the processing tool takes place. When processing is complete, the port door returns to its home position in the port plate, at which point the U-shaped member on the pivoting deck 122 again engages the rod 130 (as shown in FIGS. 1, 2 and 5A), and the pivoting deck once again attaches to and moves with the lower pivoting cover section 118.

It is desirable to add a damper to the system to prevent rapid opening and closing of a cover assembly 108, which rapid opening and closing can rattle or dislodge the workpieces seated within cassette 110. As such, in addition to providing a rotational mounting of the pivoting deck 122 to the port door 104, bearing/damper assemblies 150 additionally include motion dampening mechanisms. In a preferred embodiment, the bearings within each assembly 150 may comprise bearings including two or more frictionally engaging washers which impart a resistance to the rotation of the bearings. The washers are preferably spring biased against each other, and are preferably formed of stainless steel and teflon to minimize particle generation. The assemblies 150 are preferably sealed to prevent any such particulates from escaping into the system.

As discussed above, the pivoting deck 122 is affixed to the lower pivoting cover section during opening and closing of the cover assembly 108, so that the resistance from bearing/damper assemblies 150 is imparted to the cover assembly 108. It is understood that the degree to which the motion damping bearings within the assembly 150 resist rotation may vary as the cover sections move between their open and closed positions. For example, where the lower pivoting cover section pivots outward 85°, the assemblies 150 may resist pivoting at a rate of about 40% dampening for the middle 35° of rotation, and 100% dampening for the first and last 25° of rotation in each direction. It is understood that each of these percentages and degree ranges may vary in alternative embodiments. Alternatively, it is contemplated that the assemblies 150 impart a constant resistance across the entire range of pivot of the upper and lower pivoting cover sections.

Up to this point, the port door has been described as moving downward while the port plate remains stationary. However, it is also contemplate that, after the bare cassette is loaded onto the I/O port as described above, the port door remains stationary and the port plate with the cover assembly move upwards away from the port door, pivoting deck and cassette. It is also contemplated that both the port door and port plate are capable of movement after the bare cassette is loaded onto the I/O port as described above.

Up to this point, the cover assembly 108 has been described as including three sections, one stationary and two pivoting. It is further understood that the cover assembly 108 may include only two sections, one stationary and one pivoting. In this embodiment, a section of the cover may pivot outward to accept the cassette oriented at or near vertical as described above. Thereafter, the pivoting section may pivot inward to orient the workpieces in a substantially horizontal plane.

In an alternative embodiment of the present invention shown in FIGS. 6–10, a housing assembly 200 is provided, which housing assembly replicates a SMIF pod which would be loaded onto an I/O port. The housing assembly 200 includes a stationary cover section 202, a pivoting cover section 204, and a door 206. A pivot assembly 208 is provided to allow manual pivoting of the pivoting cover section 204 between an open position shown in FIG. 6 and a closed position shown in FIG. 7. It is understood that an automated pivot assembly may be used in an alternative embodiment.

In operation, the enclosure assembly 200 is seated on a conventional I/O port such as port 106 of the first embodiment. A bare cassette 110 is brought to the I/O port and manually loaded onto the door 106 so that the workpieces within the cassette are horizontally oriented. As shown in the top view of FIG. 8, door 206 may include registration features 210 for ensuring that the cassette is properly oriented on the door 206. After the cassette 110 is seated on door 206, pivoting cover section 204 is moved to its closed position. Pivot assembly 208 includes a pin 209 pivotally affixing the pivoting cover section 204 to the stationary cover section 202, and a damper assembly 211 to prevent rapid opening or closing of the pivoting cover section 204. The damper assembly may be a pneumatic or hydraulic damper of known construction. Alternatively, pivot assembly 208 may comprise frictional bearings as in assemblies 150 discussed above.

Figure 7:
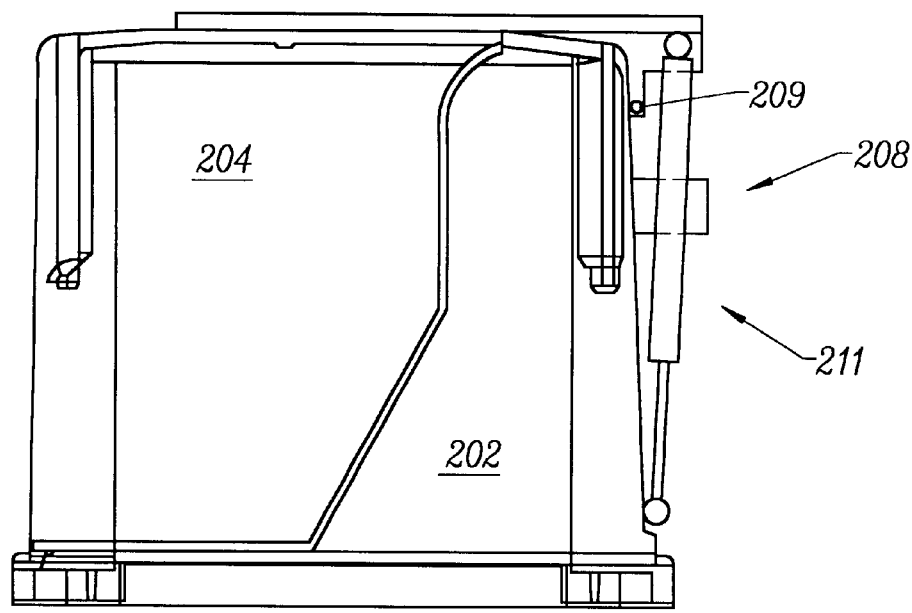
FIG. 7 is a side view of an alternative embodiment of an enclosure according to the present invention with the cover sections in a closed position.
Figure 8:
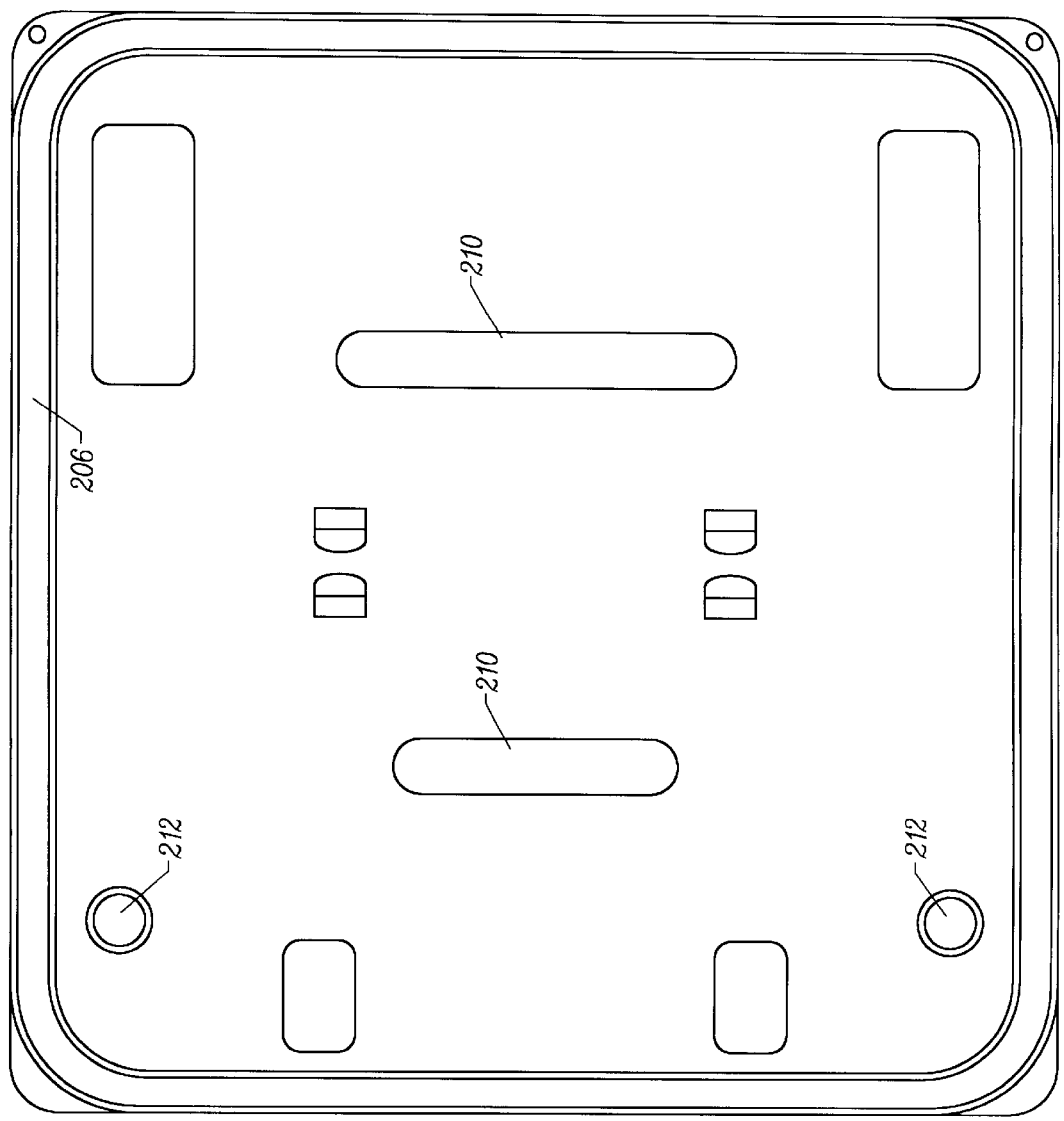
FIG. 8 is a top view of a door according to the alternative embodiment of FIGS. 7 and 8.

Pivoting cover section 204 includes a pair of stationarily mounted fingers (not shown) which engage buttons 212 on the door 206 when the pivoting cover section 204 moves to its closed position shown in FIG. 7. The fingers on the pivoting cover section 204 and the buttons 212 on door 206 are located toward the sides of the cover assembly 200, and do not interfere with proper seating of the cassette 110 on the door 206. Referring now to the bottom view of door 206 shown in FIG. 9, the bottom of door 206 is configured substantially with the same features and components as a SMIF pod door of conventional design. The door includes a latching assembly having a latch hub 214 which engages first and second translating latch plates 216. Mechanisms in the form of a driven latch keys (not shown) extend from the port door into openings 218 in latch hub 214 to thereby rotate the latch hub clockwise and counterclockwise. Rotation of the latch hub 214 will cause translation of the first and second latch plates 216 in opposite directions. In conventional SMIF pods, the latch plates are used to latch the pod door to the pod shell, and to allow decoupling of the pod door from the pod shell upon rotation of latch hub 214. Further details related to such a latch assembly are disclosed in U.S. Pat. No. 4,995,430 entitled "Sealable, Transportable Container Having Improved Latch Mechanism", to Bonora, et al., which patent is owned by the assignee of the present application, and which patent is incorporated by reference herein in its entirety.

Figure 9:
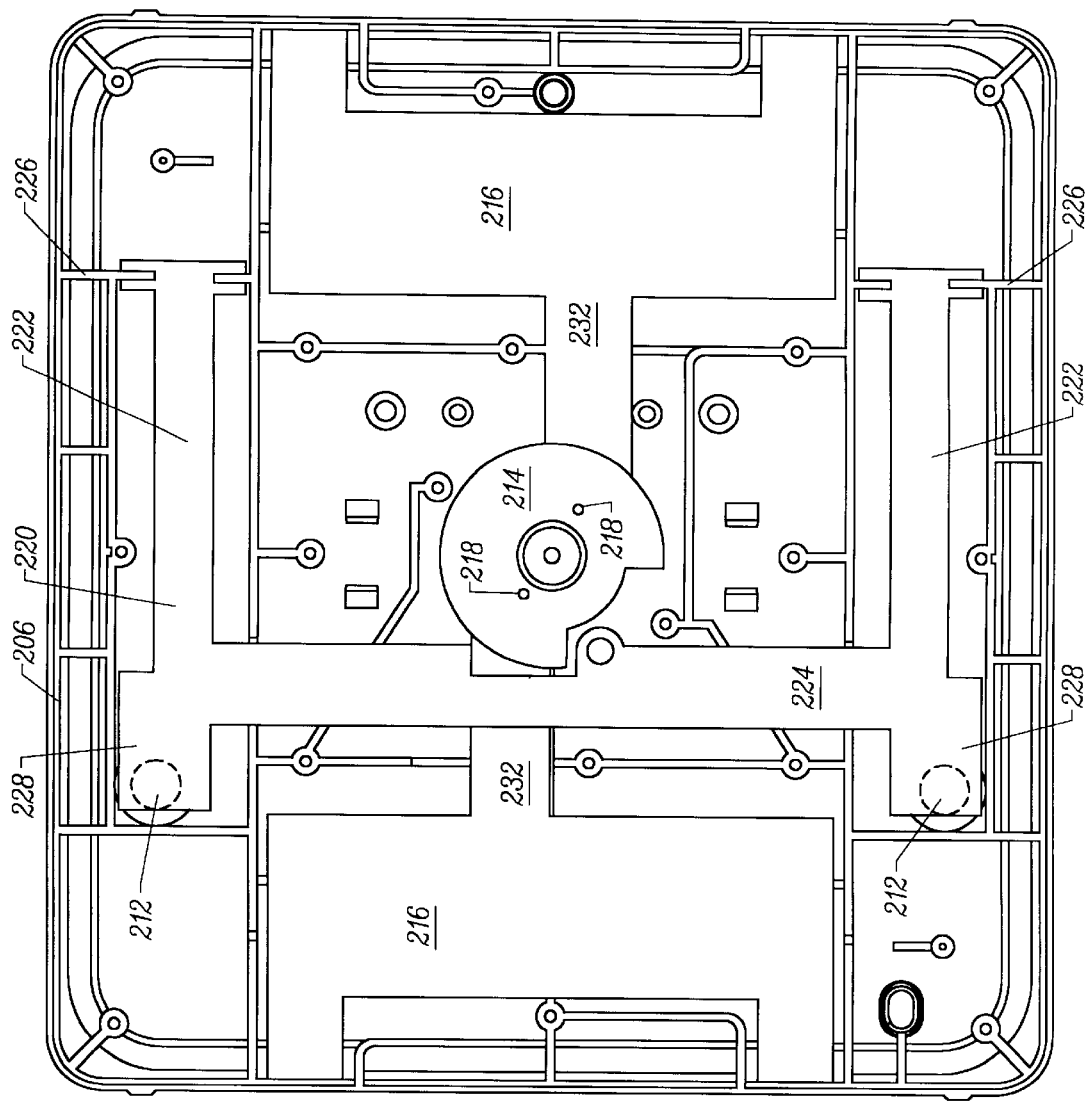
FIG. 9 is a bottom view of a door according to the alternative embodiment of FIGS. 7 and 8.
Figure 10:
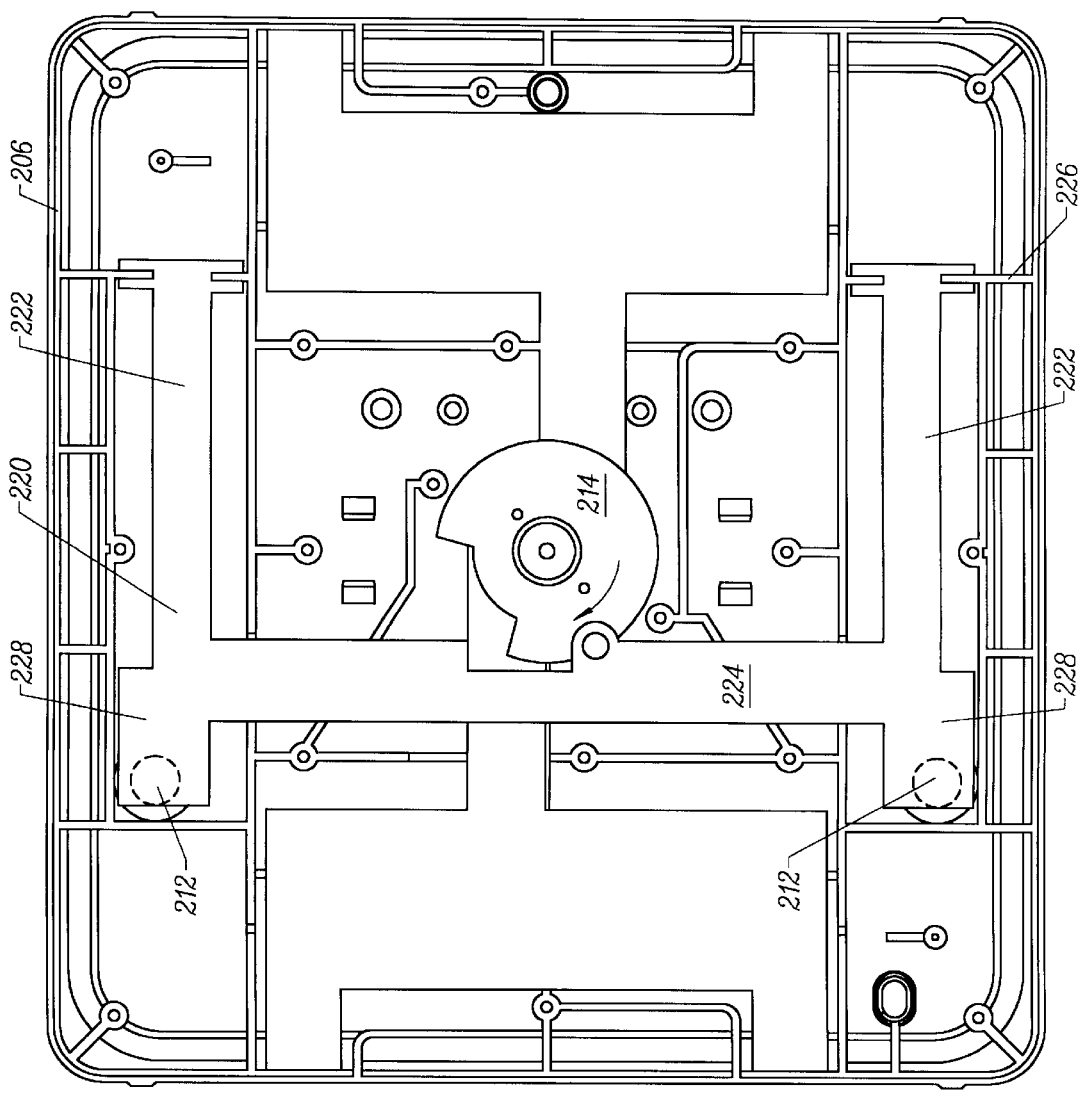
FIG. 10 is a bottom view of a door according to the alternative embodiment of FIGS. 7 and 8 with the latch hub rotated clockwise.

In addition to conventional components, the door 206 further includes a substantially C-shaped member 220 having arms 222 and connecting portion 224 extending between arms 222. The end of arms 222 are seated within respective slots formed in ribs 226. The ribs 226 form an axis about which the C-shaped member 220 pivots (into and out of the page as shown in FIG. 9).

Once the pivoting cover section 204 is in the closed position shown in FIG. 7, the fingers on the cover section engage buttons 212 on the top surface of door 206 as explained above. The buttons 212 extend through the door 206 and are mounted on the corner portions 228 of member 220. Such engagement causes the connecting portion 224 to pivot out of the page with respect to the view shown in FIG. 9. Bias out of the page, connecting section 224 engages and activates the pod-in-place sensor on the port door. Upon activation of this sensor, the latch keys in the port door rotate latch hub 214 to retract latch plates 216. Thereafter, the port door 104 and door 206 with cassette 110 seated thereon move downward away from the port plate so that processing of the workpieces within cassette 110 may occur.

In addition to activation of the latch key in the port door, activation of the pod-in-place sensor also causes the fingers 134 on the port plate (discussed above with respect to FIGS. 4A–4C) to rotate inward to engage the pivoting cover section 204. Thus, the cover section 204 may not be lifted by an operator while the port door is away from the port plate.

As the port door 104 and door 206 move downward, the cover sections 202 and 204 remain stationarily seated on port plate 102, and thus the fingers disengage from the buttons 212 on door 206. The buttons 212 consequently stop biasing the corners 228 of member 220 out of the page as shown in FIG. 9. However, this alternative embodiment makes use of the fact that once the pod-in-place sensor is activated, the latch hub 214 is rotated from the position shown in FIG. 9 clockwise to the position shown in FIG. 10. In this position, a portion of the latch hub 214 is located under the connecting portion 224, and the connecting portion therefore remains pivoted out of the page from the perspective in FIGS. 9 and 10, and thus remains in contact with the pod-in-place sensor.

After processing of the wafer is completed and the port door and port plate are again coextensive, the control system rotates the latch hub counterclockwise back to the position in FIG. 9, and the latching fingers on the port plate return to their retracted position. The pivoting cover section 204 may thereafter be manually lifted to remove the bare cassette from the enclosure assembly 200.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A loading assembly for loading a bare cassette supporting at least one workpiece into a processing station, the loading assembly comprising:

a SMIF input/output port having a port door and a port plate surrounding said port door, said port door moving vertically with respect to said port plate into the processing station;

a stationary cover section mounted to said port plate;

a pivoting cover section pivotally mounted with respect to said stationary cover section to move between a first position where a cassette may be loaded into said stationary cover section, and a second position where said pivoting cover section and said stationary cover section substantially isolate the cassette loaded into said stationary cover section from ambient atmospheric conditions; and a mechanism for receiving the cassette in an orientation where the cassette supports a workpiece in a substantially vertical orientation, and for rotating the cassette until the cassette supports the workpiece in a substantially horizontal orientation.

2. A cover assembly for a SMIF port, the SMIF port having a port door and a port plate surrounding the port door, the port door moving vertically with respect to the port plate to introduce a bare cassette into a processing station, comprising:

a stationary cover section mounted to the port plate;

a pivoting cover section mounted with said stationary cover section, to pivot between a first position in which the cassette may be loaded into said stationary cover section and a second position in which said stationary cover section and said pivoting cover section create a controlled environment for the cassette loaded into said stationary cover section; and a mechanism for receiving the cassette in an orientation where the cassette supports a workpiece in a substantially vertical orientation, and for rotating the cassette until the cassette supports the workpiece in a substantially horizontal orientation.

3. A cover assembly for a SMIF port having a port door and a port plate surrounding the port door, the port door moving vertically with respect to the port plate to introduce a bare cassette into a processing station, comprising:

a stationary cover section mounted to the port plate;

a pivoting cover section mounted with said stationary cover section, to pivot between a first position in which the cassette may be loaded into said stationary cover section and a second position in which said stationary cover section and said pivoting cover section create a controlled environment for the cassette loaded into said stationary cover section; and a mechanism for receiving the cassette in an orientation where the cassette supports a workpiece in a substantially vertical orientation, and for rotating the cassette within the cover assembly until the cassette supports the workpiece in a substantially horizontal orientation.

\* \* \* \* \*